(12) United States Patent
Papananos

(10) Patent No.: US 8,331,896 B2
(45) Date of Patent: *Dec. 11, 2012

(54) METHOD OF OPERATION OF A PASSIVE HIGH-FREQUENCY IMAGE REJECT MIXER

(75) Inventor: Ioannis Papananos, Vrilissia (GR)

(73) Assignee: Theta S.A., Marousi (GR)

( * ) Notice: Subject to any disclaimer, the term of this patent is extended or adjusted under 35 U.S.C. 154(b) by 193 days.

This patent is subject to a terminal disclaimer.

(21) Appl. No.: 12/832,964

(22) Filed: Jul. 8, 2010

(65) Prior Publication Data

US 2011/0009081 A1 Jan. 13, 2011

Related U.S. Application Data

(60) Provisional application No. 61/213,754, filed on Jul. 10, 2009.

(51) Int. Cl.
H04B 1/10 (2006.01)

(52) U.S. Cl. .................................. 455/302; 455/296

(58) Field of Classification Search .................. 455/333, 455/318, 326, 313, 315, 302, 324, 285, 296
See application file for complete search history.

(56) References Cited

U.S. PATENT DOCUMENTS

| 5,870,670 | A | 2/1999 | Ripley et al. |
| 5,950,119 | A | 9/1999 | McGeehan et al. |
| 6,029,059 | A | 2/2000 | Bojer |
| 6,226,509 | B1 | 5/2001 | Mole et al. |
| 6,308,058 | B1 | 10/2001 | Souetinov et al. |
| 6,324,388 | B1 | 11/2001 | Souetinov |
| 6,529,719 | B1 * | 3/2003 | Imbornone et al. ........... 455/302 |
| 6,597,899 | B2 | 7/2003 | Souetinov et al. |
| 6,687,494 | B1 | 2/2004 | Mourant |
| 6,901,248 | B1 | 5/2005 | Cowley |
| 7,016,664 | B2 * | 3/2006 | Souetinov ..................... 455/323 |

(Continued)

FOREIGN PATENT DOCUMENTS

WO WO-2005/091493 9/2005

OTHER PUBLICATIONS

"International Search Report and Written Opinion of the International Searching Authority Dated Dec. 2, 2010", International Application No. PCT/IB2010/001704.

(Continued)

*Primary Examiner* — Sonny Trinh
(74) *Attorney, Agent, or Firm* — Blakely Sokoloff Taylor & Zafman LLP

(57) ABSTRACT

A passive implementation of an image reject mixer (IRM), capable of operating at very high frequency, is operative according to the disclosed method. The IRM comprises a quad MOS multiplier and a lumped-element hybrid, resulting in a passive IRM. Operative at a radio frequency (RF) of tens of GHz with an intermediate frequency (IF) of several GHz. The RF+ and RF− signals are provided to two quad MOS multipliers. A local oscillator signal (LO) is used to provide LO+ and LO− signals to one of the multipliers and by providing the LO to a phase shifter, generated are a ninety degree shifted LO+ and LO− signals provided to the other multiplier. Providing the hybrids with the outputs of both multipliers and selecting an appropriate IF signal from each of the hybrids ensures the proper operation of the passive IRM.

17 Claims, 3 Drawing Sheets

U.S. PATENT DOCUMENTS

| | | | |
|---|---|---|---|
| 7,184,724 B1 | 2/2007 | Ashby et al. | |
| 7,333,791 B2 | 2/2008 | Richter et al. | |
| 7,369,835 B2 * | 5/2008 | Margairaz et al. | 455/302 |
| 7,403,761 B2 * | 7/2008 | Ashby et al. | 455/314 |
| 7,437,345 B2 * | 10/2008 | Iida | 706/62 |
| 7,466,973 B2 | 12/2008 | Armbruster et al. | |
| 7,509,112 B2 * | 3/2009 | Fujii | 455/327 |
| 7,711,346 B2 * | 5/2010 | Ashby et al. | 455/314 |
| 2001/0027095 A1 | 10/2001 | Wang | |
| 2002/0183033 A1 | 12/2002 | Gu et al. | |
| 2003/0129955 A1 | 7/2003 | Gilmore | |
| 2004/0043740 A1 | 3/2004 | Magnusen et al. | |
| 2005/0143038 A1 | 6/2005 | Lafleur | |
| 2006/0189290 A1 | 8/2006 | Olson | |
| 2007/0066267 A1 | 3/2007 | Ashby | |
| 2007/0218857 A1 | 9/2007 | Ismail et al. | |
| 2008/0014896 A1 | 1/2008 | Zhuo et al. | |
| 2008/0246875 A1 | 10/2008 | Ashby et al. | |

OTHER PUBLICATIONS

Lu, Liang-Hung, et al., "Design and Implementation of Micromachined Lumped Quadrature (90°) Hybrids", *2001 IEEE MTT-S International Microwave Symposium Digest*, (May 20, 2001), pp. 1285-1288.

"Overview on Lange Coupler Design", *Agilent Technologies, Inc.*, 5989-8911EN, (Sep. 1, 2001).

* cited by examiner

_METHOD OF OPERATION OF A PASSIVE HIGH-FREQUENCY IMAGE REJECT MIXER_

CROSS-REFERENCE TO RELATED APPLICATION

This patent application claims the benefit of U.S. provisional patent application No. 61/213,754, filed Jul. 10, 2009. The patent is related to a co-pending patent application entitled "A Passive High-Frequency Image Reject Mixer" assigned to a common assignee and is being filed on the same date.

STATEMENT OF SUPPORT

The work that led to the development of this invention was co-financed by Hellenic Funds and by the European Regional Development Fund (ERDF) under the Hellenic National Strategic Reference Framework (NSRF) 2007-2013, according to Contract no. MIKRO2-34 of the project "Next Generation Millimeter Wave Backhaul Radio-THETA", within the Program "Hellenic Technology Clusters in Microelectronics-Phase-2 Aid Measure".

BACKGROUND OF THE INVENTION

1. Field of the Invention

The present invention relates generally to image reject mixers, and more specifically to a method of operation of a passive image reject mixer operating at frequencies up to several tens of gigahertz and above.

2. Prior Art

As wireless communication progresses, the frequency of operation increases dramatically. Currently frequencies of tens of GHz are employed and are expected to increase over time. Operation at high frequencies is also known to be demanding in power as well as technology. That is, for the same design, the higher the frequency of operation the higher the power consumption. The higher frequency range also requires use of more esoteric manufacturing technologies, such as GaAs, that are capable of effectively addressing the frequency requirements, but such manufacturing technologies have a price from both a technology and a power perspective. As long as demand for such products is low, such technologies are tolerated, but as the need for mass production arises, it is required to utilize technologies that are more power friendly as well as less esoteric.

In order to reduce costs, there is a tendency to move from a more expensive process technology to a lower cost process technology, e.g., moving from GaAs to CMOS. However, a lower cost technology, such as CMOS, may suffer from other disadvantages. In the area of image reject mixers (IRMs) targeted to operate at frequencies in the range of tens of GHz, CMOS based technologies are not currently used, and hence the advantages associated with such technologies are not achieved. Moreover, active components are used, with the Gilbert cell being the prominent solution. An alternative approach is shown in FIG. 1. The MOS down-conversion multiplier mixer 100 comprises a quad MOS cell 110 and a transresistance amplifier 120 that is used to convert the mixer output current to voltage signal. Together with the capacitors 130, it further acts as a low-pass filter in order for only the intermediate frequency (IF) to pass through. The quad MOS cell 110 is a balanced mixer operative as a multiplying mixer. The RF signal at the input of the mixer is multiplied by the local oscillator (LO) signal. The low-pass filter of this circuit 100 cuts-off the RF+LO product while maintaining the IF RF−LO frequency.

The current art is limited because of its inability to provide frequency mixers that are low on power consumption, are implemented on cost-effective integrated circuit (IC) technologies, and are capable of operating at high intermediate (IF) frequencies, preferably in the GHz range. It would therefore be advantageous to provide a solution that overcomes the prior art limitations.

DETAILED DESCRIPTION OF THE PREFERRED EMBODIMENTS

The apparatus of the present invention is a complete passive implementation of an image reject mixer (IRM) which is capable of operating at very high frequency and is operative according to the disclosed method. The IRM comprises a pair of quad MOS multipliers and a pair of lumped-element hybrids, resulting in a passive IRM. Operative at a radio frequency (RF) of tens of GHz with an intermediate frequency (IF) of several GHz. The RF+ and RF− signals are provided to two quad MOS multipliers. A local oscillator signal (LO) is used to provide LO+ and LO− signals to one of the multipliers and by providing the LO to a phase shifter, generated are a ninety degrees shifted LO+ and LO− signals provided to the other multiplier. Providing the hybrids with the outputs of both multipliers and selecting an appropriate IF signal from each of the hybrids ensures the proper operation of the passive IRM.

Figure 1:
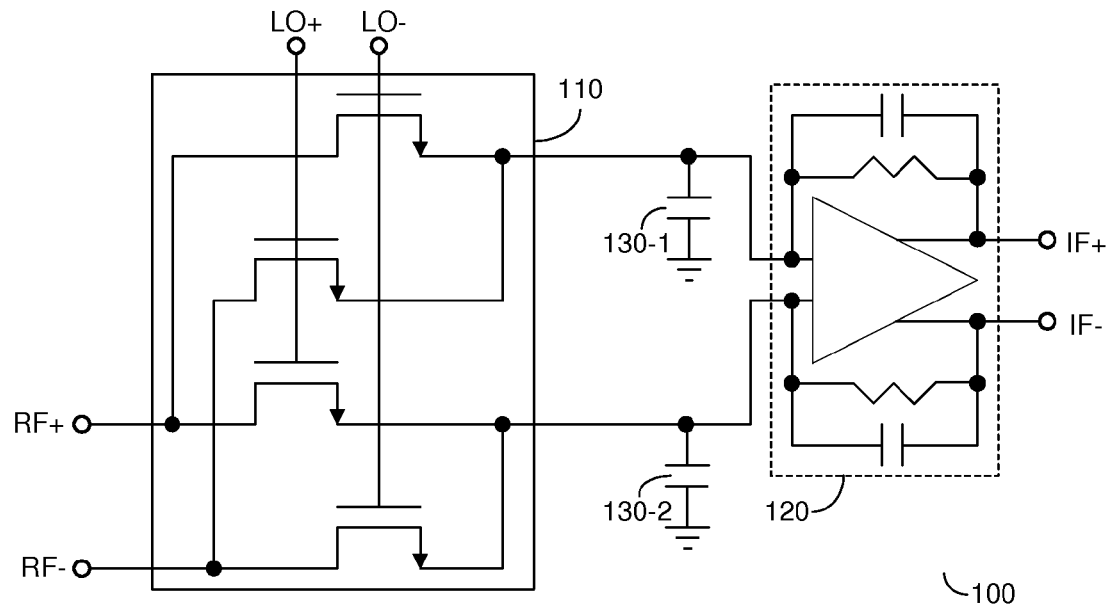
FIG. 1 is a multiplying down-conversion mixer (prior art).
Figure 2:
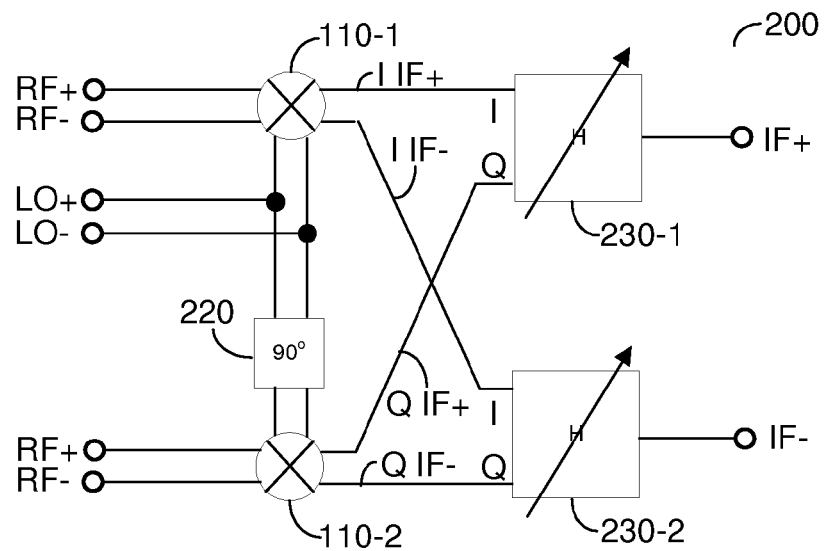
FIG. 2 is a schematic diagram of a passive IRM implemented in accordance with the principles of the invention.

In accordance with the principles of the invention, the mixer solution, depicted in FIG. 1, is modified as an IRM where the filtering action implemented with a transresistance amplifier is replaced by a lumped-element hybrid. The hybrid, further described in FIG. 3 below, functions as both a band-pass filter and as the image rejection apparatus. The result is a fully passive circuit that does not require a bias current for its operation. Reference is now made to FIG. 2 that depicts a schematic diagram of the passive IRM 200 implemented in accordance with the principles of the invention. Basically it comprises quad MOS elements 110 (110-1 and 110-2, also see FIG. 1) typically operative in the deep triode region, a phase shifter 220 and hybrids 230. The purpose of the image-reject mixer 200 is to reject the image (IM) signal that is down-converted. Present are a RF signal and a local oscillator (LO) signal. The IM signal is IM=RF+2*IF. Hence, if RF<LO, then IF=LO−RF and IM=RF+2*IF=RF+2*(LO−RF)=2*LO−RF. When it is down-converted this becomes: 2*LO−RF−LO=LO−RF=IF. In other words, there is a product from the unwanted frequency IM falling into the IF signal and it is therefore necessary to distinguish the wanted RF from the unwanted IM. The solution is to use the IRM and in accordance with the invention, to use the hybrid. Accordingly the first output of the hybrid carries the IF component that comes from the wanted RF frequency and the second hybrid output carries the IF component coming from the IM frequency. It is the positioning of the RF signal with respect to the LO signal that defines which output carries which product. This requires determination whether RF is greater than LO or RF is smaller than LO and there upon selecting the desired output from the hybrid, as further shown with respect to FIG. 3. The passive mixer (passive meaning incapable of or at least not providing gain) and hybrid combination shown in FIG. 2 not only provides image rejection but also acts like a passive filter to reject the high-frequency component (RF+LO) and eliminates the need for current to voltage conversion as the hybrids are current-driven directly from the quad MOS transistors.

Notably, the MOS cell 110 of FIG. 2 operates as a multiplying mixer, where the output is a multiplication of the radio frequency (RF) by the local oscillator (LO), or in other words RF×LO, resulting in an output of both RF+LO and RF−LO frequencies. Multipliers 110 hence receive the differential RF signals RF+ and RF−. In addition multiplier 110-1 receives the differential LO signals LO+ and LO− while the multiplier 110-2 receives the same LO signals with a 90° phase shift using phase shifter 220. The phase shifter 220, according to the invention, is a passive element, and in a typical implementation, a Lange coupler, implemented in a silicon-based technology, may be used. Accordingly, multiplier 110-1 outputs the "I IF+" and "I IF−" differential signals and multiplier 110-2 outputs the "Q IF+" and "Q IF−" differential signals. The outputs from the multipliers 110-1 and 110-2 are provided to lumped-element hybrids 230. A detailed description of a lumped-element 230 is provided with respect to FIG. 3 below. The "I IF+" output from multiplier 110-1 and the "Q IF+" output of multiplier 110-2 are provided to the inputs of hybrid 230-1. The "I IF−" output of multiplier 110-1 and the "Q IF−" output of multiplier 110-2 are provided to the inputs of the hybrid 230-2. The hybrids 230 provide the wanted "IF+" and the wanted "IF−" signals at the outputs of hybrids 230-1 and 230-2 respectively, and are further explained below with respect to FIG. 3.

Figure 3:
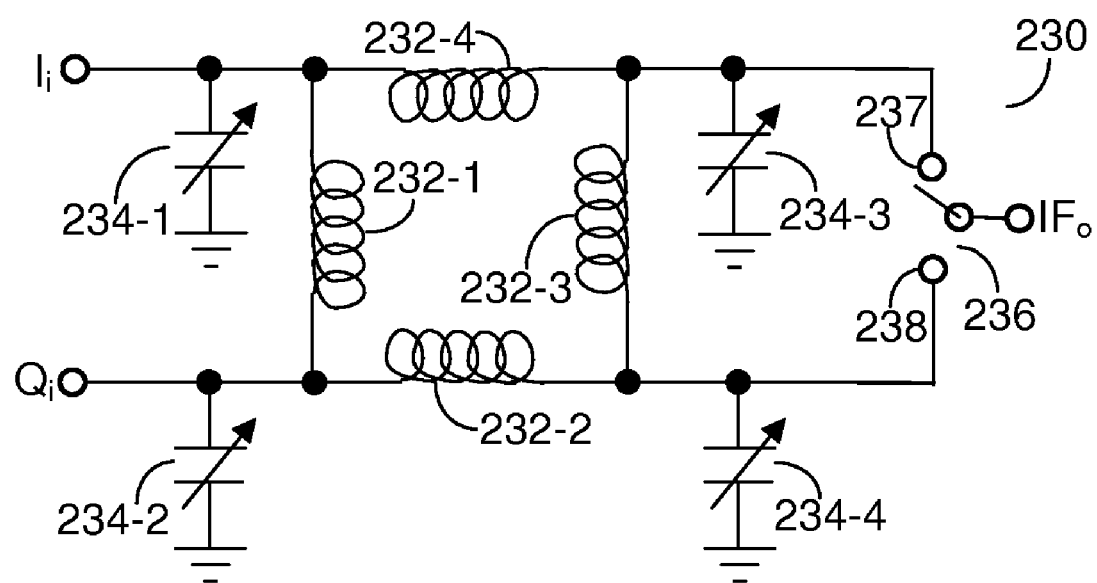
FIG. 3 is a hybrid element used as an element of the passive IRM.

To further understand the principles of the invention, reference is made to FIG. 3, depicting a lumped-element hybrid 230. The hybrid 230 comprises four inductors and four capacitors designed to mimic the behavior of a classical microwave Branchline coupler, without using MMIC technologies. The "I" input of the hybrid 230 is coupled to one port of the capacitor 234-1, the other port of which is connected to ground. Also coupled to the "I" input are two inductors, inductor 232-1 and 232-4. The other terminal of inductor 232-1 is coupled to the "Q" input of hybrid 230 as well as to terminals of capacitor 234-2, the other port of which is connected to ground, and to inductor 232-2. The other port of inductor 232-4 is coupled to the terminal 237 of the hybrid 230 as well as to terminals of capacitor 234-3, the other port of which is connected to ground, and inductor 232-3. The other ports of inductors 232-2 and 232-3 are coupled to each other as well as to a port of capacitor 234-4, the other port of which is coupled to ground, and to the terminal 238 output of hybrid 230. A switch 236 determines which of the signals present at terminals 237 and 238 is the "wanted IF" signal and accordingly connects that terminal to the $IF_O$ output of the hybrid 230. The switch has a first position when RF>LO and a second position when RF<LO. In one embodiment of the invention, one or more of the capacitors 234 are tunable, thereby allowing tuning of the hybrid. For this purpose a switched capacitor bank (not shown) or a variable capacitor (not shown) may be used, both of which are well known in the prior art, resulting in a variable hybrid 230. In an exemplary application with an IF above 1 gigahertz, such as an IF in the range of 1-7 GHz, the inductor range is 1-6 nH and the capacitor range is 1-6 pF. Inductors and capacitors in these ranges are readily and reasonably implementable in common manufacturing technologies such as CMOS technology, thereby allowing for cost-effective implementation of such integrated circuits (ICs). Furthermore, using the hybrid 230 at the output of the IRM 200 removes the need of having an operational amplifier at the output of the mixer as required by prior art solutions. In another embodiment, the IF is above 5 gigahertz.

In one embodiment of the invention (FIG. 2), a set of switches (not shown) may be connected immediately at the hybrid output enabling a selection of only one of the two outputs each time. The hybrid 230-1 provides the final IF+ and the hybrid 230-2 provides the final IF−. The reason for using both terminals 237 and 238 of the hybrid, or having them available in the first place, is that it allows different treatment of the output signal when the RF frequency is greater than the than when then the case where the LO frequency is greater than the RF frequency. By having the switches at the hybrid outputs, the appropriate output terminal can be selected depending on the frequency plan of operation of the receiver chain. This is of course unnecessary if the frequencies are fixed for a given system, as in such a case one of the two outputs can be used without employing switches. The other output may be simply connected to ground through a 50 Ohm resistor. In yet another embodiment, the "I" and "Q" outputs of the two IF signals may be added to convert the differential output to one single IF output having a double amplitude. The appropriate hybrid output has the image (IM) component suppressed and this is the image-reject operation of the mixer. In accordance with the invention, the hybrids 230 have a double role: they operate as a band-pass filter to reject the RF+LO mixer output component and as an IM rejection component.

The complete passive implementation of the IRM provides significant advantage for low power implementations and especially the use of pervasive CMOS manufacturing technologies. Specifically, it allows an implementation of the IRM for very high frequencies, for example, a 90 nanometer CMOS technology allows for a 60 GHz IRM, otherwise not implementable in such a technology. The use of the hybrid 230 enables high-frequency IF, in the range of a few GHz, a range which is compatible with an RF frequency as high as 60 GHz. Using prior art solutions, the combination of an active mixer with a hybrid would not be operative for such a high RF. Vice versa, the combination of a passive mixer with an operational amplifier instead of the hybrid, is not suitable for such an IF range. Hence the invention overcomes the deficiencies of the prior art. By further using a Lange coupler to implement the phase shifter in combination with the MOS switches and the hybrids, all for an all in a Silicon-based process, without compromising the performance necessary for a mixer operative in an RF range of several tens of GHz and an IF in the range of several GHz, and implementing the circuit on an IC.

Figure 4:
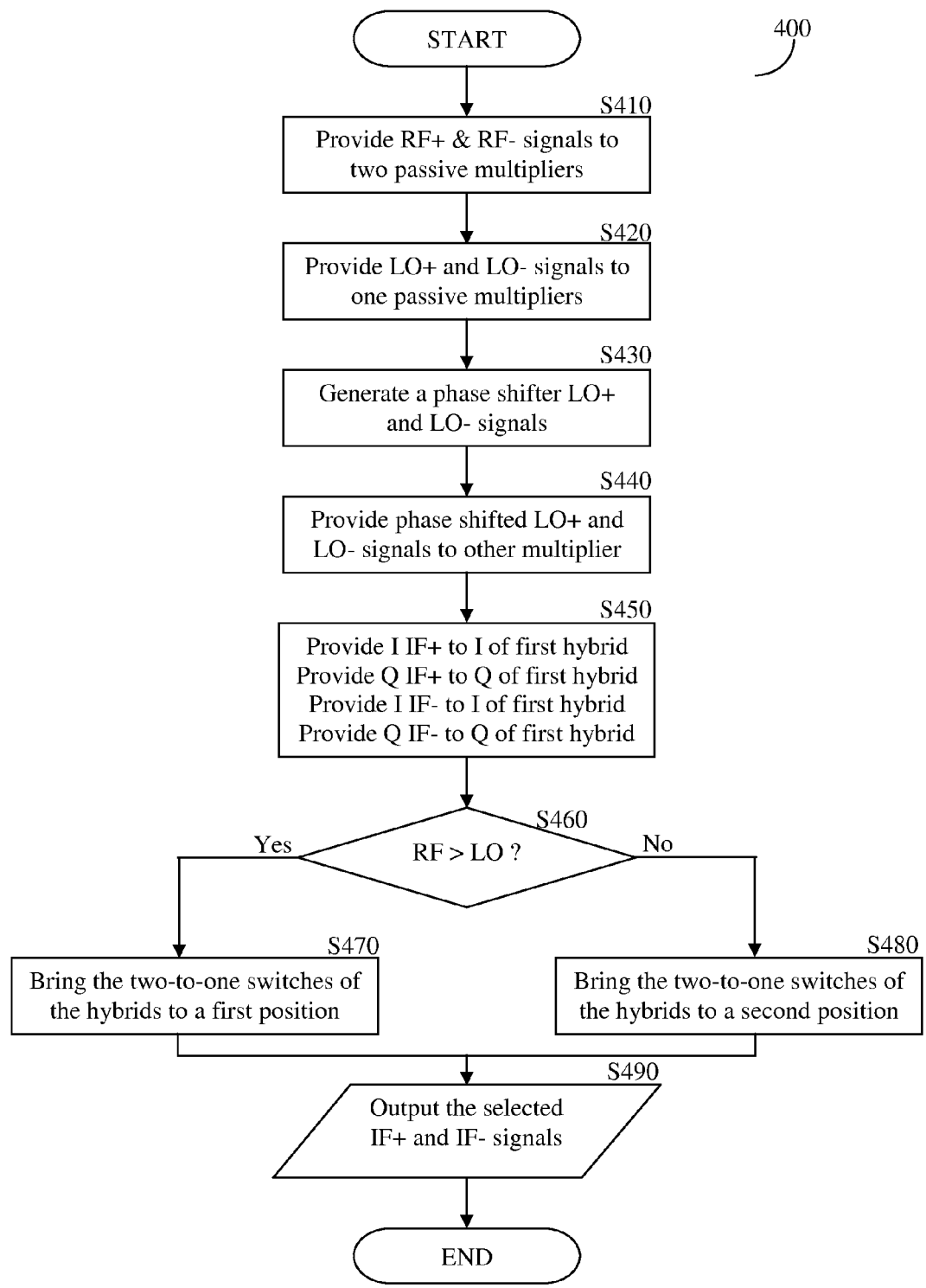
FIG. 4 is a flowchart of an operation of a passive IRM.
Figure 4:
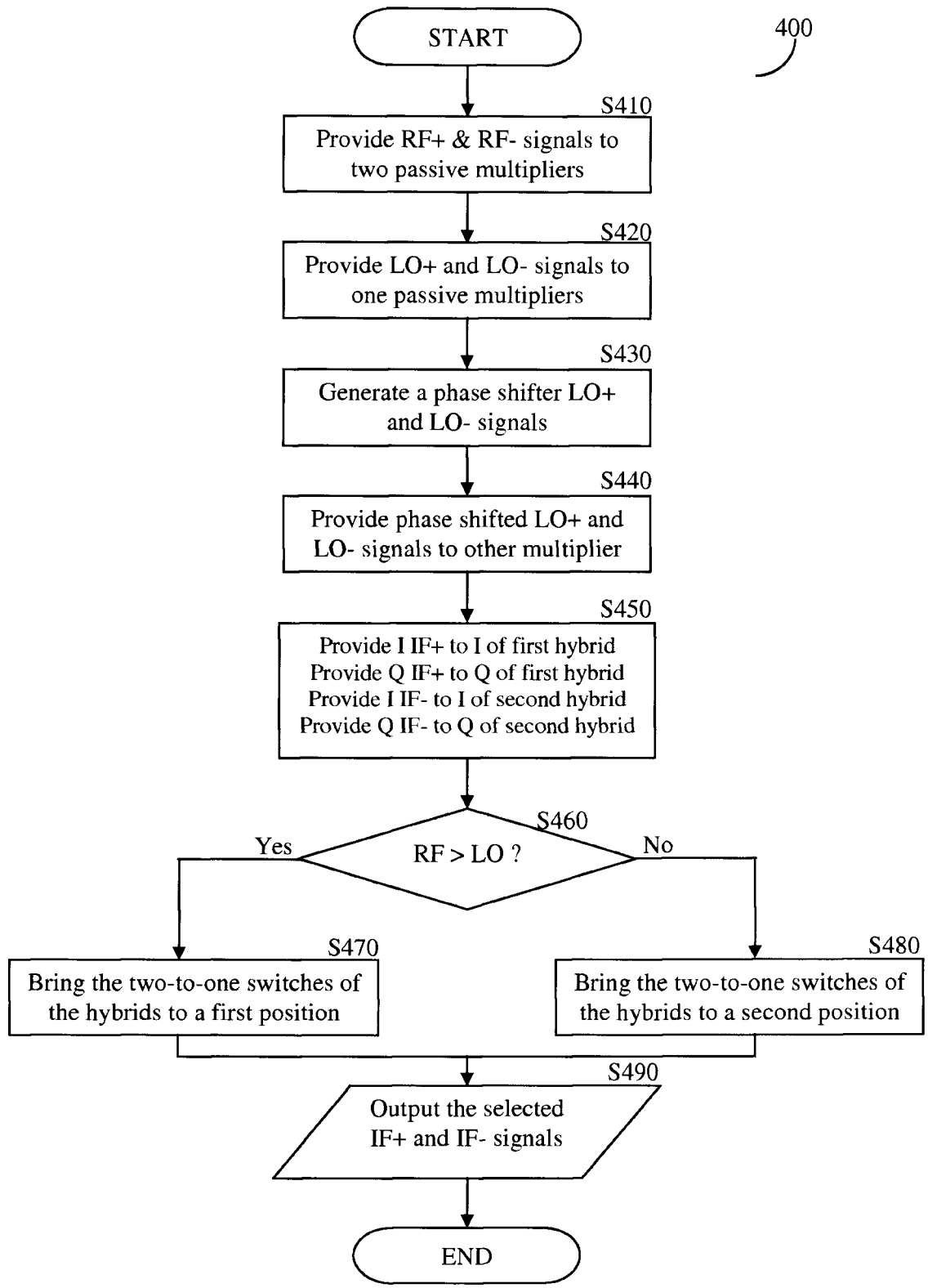

Reference is now made to FIG. 4 that depicts a flowchart 400 of an operation of a passive IRM 200. In S410 the RF+ signal and the RF− signal are provided to quad MOS multipliers, for example, multipliers 110-1 and 110-2 of FIG. 2. In S420 the LO+ and the LO− signals are provided to one of the quad MOS multipliers, for example, multiplier 110-1. In S430 the signals LO+ and LO− are shifted by ninety degrees by a phase shifter, for example, phase shifter 220, to generate a phase shifted LO+ signal and a phase shifted LO− signal. In S440 the phase shifted LO+ signal and the phase shifted LO− are provided to the other multiplier, for example, multiplier 110-2. In S450 the "I IF+" signal is provided to an "I" input of a first lumped-element hybrid, for example, hybrid 230-1; the "Q IF+" signal is provided to a "Q" input of the first lumped-element hybrid, for example, hybrid 230-1; the "I IF−" signal is provided to an "I" input of a second lumped-element hybrid, for example, hybrid 230-2; and the "Q IF−" signal is provided to a "Q" input of the second lumped-element hybrid, for example, hybrid 230-2. In S460 it is checked whether the RF is greater than the LO frequency and if so execution continues with S470; otherwise execution continues with S480. In S470 the switch in each of the hybrids 230 is put in a first position, for example position 237 for switch 236, responsive to the determination in S460. In S480 the switch in each of the hybrids 230 is put in a second position, for example position 238 for switch 236, responsive to the determination in S460. In S490, regardless of whether execution went through S470 or S480, the IF+ signal is provided from the first hybrid, for example, hybrid 230-1, and the IF− signal is provided from the first hybrid, for example, hybrid 230-2.

While certain preferred embodiments of the present invention have been disclosed and described herein for purposes of illustration and not for purposes of limitation, it will be understood by those skilled in the art that various changes in form and detail may be made therein without departing from the spirit and scope of the invention. Specifically, the circuit disclosed is applicable to any Silicon-based manufacturing process, including MOS, BiCMOS and CMOS processes. The upper limit of the RF is determined by the process geometry.

What is claimed is:

1. A method for operating a passive image reject mixer (IRM) comprising:
   providing a first MOS multiplier with a radio frequency RF+ and RF− input signals;
   providing said first MOS multiplier with local oscillator LO+ and a LO− input signals;
   generating an intermediate frequency I IF+ and I IF− output signals responsive of said radio frequency RF+ and RF− input signals, and said local oscillator LO+ and LO− input signals, provided to said first MOS multiplier;
   generating ninety degree phase shifted LO+ and ninety degree phase shifted LO− output signals from said local oscillator LO+ and LO− input signals, respectively, using a passive phase shifter;
   providing a second MOS multiplier with said radio frequency RF+ and RF− input signals;
   providing said first MOS multiplier with said ninety degree phase shifted LO+ and said ninety degree phase shifted LO− output signals;
   generating IF Q IF+ and Q IF− output signals responsive of said radio frequency RF+ and RF− input signals, and said ninety degree shifted LO+ and LO− output signals, provided to said second MOS multiplier;
   generating an IF+ output signal responsive to a determination whether the radio frequency is greater or less than a frequency of the local oscillator, and further responsive to said I IF+ output signal and said Q IF+ output signal; and
   generating an IF− output signal responsive to a determination whether the radio frequency is greater or less than a frequency of the local oscillator, and further responsive to said I IF− output signal and said Q IF− output signal.

2. The method of claim 1, further comprising:
   operating said first MOS multiplier and said second MOS multiplier in deep triode region.

3. The method of claim 1, wherein said IF frequency is above one giga Hertz.

4. The method of claim 1, further comprising:
   providing an RF frequency that is above five giga Hertz.

5. The method claim 1, wherein said generating IF+ and IF− output signals comprises having first and second lumped-element hybrid communicatively coupled to said first and second MOS multipliers.

6. The method claim 5, wherein said lumped-element hybrid comprises:
   a first capacitor, having a first terminal coupled to an I input of said lumped-element hybrid;
   a second capacitor, having a first terminal coupled to a Q input of said lumped-element hybrid;
   a third capacitor, having a first terminal coupled to a first input of a two-to-one switch of said lumped-element hybrid;
   a fourth capacitor, having a first terminal coupled to a second input of said two-to-one switch of said lumped-element hybrid;
   a first inductor coupled between said I input and said first input of said two-to-one switch;
   a second inductor coupled between said Q input and said second input of a two-to-one switch;
   a third inductor coupled between said I input and said Q input;
   a fourth inductor coupled between said first input of said two-to-one switch and said second input of said two-to-one switch; and
   said two-to-one switch coupled to an IF output terminal of said lumped-element hybrid and enabled to select between said first input of said two-to-one switch and said second input of said two-to-one switch responsive of said determination whether the radio frequency is greater than or less than a frequency of the local oscillator.

7. The method of claim 6, further comprising:
   toggling said two-to-one switch to a first position when the radio frequency is greater than the local oscillator frequency.

8. The method of claim 6, further comprising:
   toggling said two-to-one switch to a second position when the radio frequency is greater than the local oscillator frequency.

9. The method of claim 6, wherein at least one of said first capacitor, said second capacitor, said third capacitor and said fourth capacitor is enabled to be tuned to provide variable capacitance to tune said lumped-element hybrid.

10. The method of claim 9, further comprising:
    tuning at least one of said first capacitor, said second capacitor, said third capacitor and said fourth capacitor.

11. The method of claim 10, wherein said tuning is in a range of one to six pico-Farads.

12. The method of claim 6, wherein at least one of said first capacitor, said second capacitor, said third capacitor and said fourth capacitor is a switched capacitor bank comprising a plurality of capacitors.

13. The method of claim 12, further comprising:
    switching said switched capacitor bank of at least one of said first capacitor, said second capacitor, said third capacitor and said fourth capacitor.

14. The method of claim 13, wherein said switching is in a range of one to six pico-Farads.

15. The method of claim 6, wherein each of said first capacitor, said second capacitor, said third capacitor and said fourth capacitor has a capacitance in the range of one to six pico-Farads.

16. The method of claim 6, wherein each of said first inductor, said second inductor, said third inductor and said fourth inductor has an inductance in the range of one to six nano-Henry.

17. The method of claim 1, wherein said passive phase shifter is a Lange coupler.

* * * * *

UNITED STATES PATENT AND TRADEMARK OFFICE
CERTIFICATE OF CORRECTION

PATENT NO.          : 8,331,896 B2
APPLICATION NO.     : 12/832964
DATED               : December 11, 2012
INVENTOR(S)         : Papananos Page 1 of 2

It is certified that error appears in the above-identified patent and that said Letters Patent is hereby corrected as shown below:

On the title page, illustrative figure 4 should be substituted with FIG. 4 on the attached replacement drawing sheet 3 of 3.

Signed and Sealed this
Twenty-sixth Day of February, 2013

Teresa Stanek Rea
*Acting Director of the United States Patent and Trademark Office*